(12) United States Patent
Huang et al.

(10) Patent No.: US 6,884,728 B2
(45) Date of Patent: Apr. 26, 2005

(54) METHOD FOR REMOVING POLYMERIC RESIDUE CONTAMINATION ON SEMICONDUCTOR FEATURE SIDEWALLS

(75) Inventors: Jun-Lung Huang, Hsin-Chu (TW); Jen-Cheng Liu, Chia-Yi (TW); Ching-Hui Ma, Tainan (TW); Yi-Chen Huang, Hsin-Chu (TW); Yin-Shen Chu, Taichung (TW); Hong-Ming Chen, Taipei County (TW); Li-Chih Chaio, Tooyang (TW)

(73) Assignee: Taiwan Semiconductor Manufacturing Co., Ltd., Hsin Chu (JP)

( * ) Notice: Subject to any disclaimer, the term of this patent is extended or adjusted under 35 U.S.C. 154(b) by 357 days.

(21) Appl. No.: 10/289,972

(22) Filed: Nov. 6, 2002

(65) Prior Publication Data

US 2004/0087167 A1 May 6, 2004

(51) Int. Cl.[7] ............................................. H01L 21/311
(52) U.S. Cl. ...................................... 438/700; 438/725
(58) Field of Search ................. 438/618, 622, 438/623, 637, 700, 706, 723, 724, 725

(56) References Cited

U.S. PATENT DOCUMENTS 6,114,243 A * 9/2000 Gupta et al. ................ 438/687
6,440,861 B1 * 8/2002 Liu et al. .................... 438/706
6,528,428 B1 * 3/2003 Chen et al. ................. 438/700
6,720,256 B1 * 4/2004 Wu et al. .................... 438/638
6,803,318 B1 * 10/2004 Qiao et al. .................. 438/700

* cited by examiner

Primary Examiner—Kin-Chan Chen
(74) Attorney, Agent, or Firm—Tung & Associates

(57) ABSTRACT

A method for improving a photolithographic patterning process to avoid undeveloped photoresist contamination in a semiconductor manufacturing process including providing a first semiconductor feature having an anisotropically etched opening including sidewalls. The first semiconductor feature further provide an overlying photoresist layer photolithographically patterned for anisotropically etching a second semiconductor feature opening overlying and encompassing the first semiconductor feature; blanket depositing a polymeric passivation layer over the overlying photoresist layer including covering at least a portion of the sidewalls including polymeric containing residues; and, removing the polymeric passivation layer including a substantial portion of the polymeric containing residues from at least a portion of the sidewalls prior to anisotropically etching the second semiconductor feature.

20 Claims, 2 Drawing Sheets

METHOD FOR REMOVING POLYMERIC RESIDUE CONTAMINATION ON SEMICONDUCTOR FEATURE SIDEWALLS

FIELD OF THE INVENTION

This invention generally relates to photolithographic patterning of semiconductor features and more particularly to an improved method for manufacturing semiconductor features such as via-first dual damascene structures while eliminating problems caused by polymeric residue contaminations including undeveloped photoresist on via sidewalls.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to eliminate interfering effects occurring in the semiconductor wafer manufacturing process.

In the fabrication of semiconductor devices multiple layers may be required for providing a multi-layered interconnect structure. <During the manufacture of integrated circuits it is common to place material photoresist on top of a semiconductor wafer in desired patterns and to etch away or otherwise remove surrounding material not covered by the resist pattern in order to produce metal interconnect lines or other desired features. During the formation of semiconductor devices it is often required that the conductive layers be interconnected through holes in an insulating layer. Such holes are commonly referred to as vias, i.e., when the hole extends through an insulating layer between two conductive areas. Metal interconnecting lines (trench lines) are typically formed over the vias to electrically interconnect the various semiconductor devices within and between multiple layers. The damascene process is a well known semiconductor fabrication method for forming electrical interconnects between layers by forming vias and trench lines.

For example, in an exemplary process for forming dual damascene structures, a via opening is first etched in an insulating layer also known as an inter-metal or inter-level dielectric (IMD/ILD) layer. The insulating layer is typically formed over a metal or conductive layer. After a series of photolithographic steps defining via openings and trench openings, the via openings and the trench openings are filled with a metal (e.g., Al, Cu) to form vias and trench lines, respectively. The excess metal above the trench level is then removed by well known chemical-mechanical polishing (CMP) processes.

After the via holes are etched, but before the holes are filled with a conductive material, for example, copper, the photoresist mask which remains on top of the desired features may be removed by a dry etching method known as a reactive ion etch (RIE) or ashing process using a plasma formed of $O_2$ or a combination of CF, and $O_2$ to react with the photoresist material.

As feature sizes in etching process have become increasingly smaller, photolithographic processes have been required to use photoresist activating light (radiation) of smaller wavelength. Typically a deep ultraviolet (DUV) activating light source with wavelength less than about 250, for example, from about 193 nm to about 248 nm is used. Exemplary DUV photoresists, for example, include PMMA and polybutene sulfone.

One problem affecting DUV photoresist processes has been the interference of residual nitrogen-containing species with the DUV photoresist. Residual nitrogen-containing contamination is one of the greater concerns in the use or application of metal nitride films such as silicon nitride or silicon oxynitride as hard mask layer or silicon oxynitride as a DARC. The problem is exacerbated by the increasing use of low-k dielectric materials typically having a high degree of porosity, thus facilitating absorption and transport of contaminating chemical species. For example, it is believed that nitrogen radicals created due to the presence of nitrogen containing species, such as amines, interfere with chemically amplified photoresists, for example DUV photoresists by neutralizing the acid catalyst, thereby rendering that portion of the photoresist insoluble in the developer. As a result, residual photoresist may remain on patterned feature edges, sidewalls, or floors of features, affecting subsequent etching or metal filling processes leading to, for example, electrical open circuits or increased resistivity.

In a via-first dual damascene process, a method is disclosed for forming a via plug at least partially filling the via opening in commonly assigned co-pending application 2001-0155, Ser. No. 10/035,690, filed Nov. 8, 2001, which is incorporated herein by reference. For example, following formation of a via opening, a via plug of polymeric material, for example, photoresist is optionally formed to at least partially fill the via opening to protect via sidewalls in subsequent anisotropic etching processes to form a trench opening overlying and encompassing one or more via openings. Typically, a DUV photoresist is used to photolithographically pattern trench openings for anisotropic etching overlying the via openings. Frequently, the DUV photoresist layer used for patterning the trench openings, forms an undeveloped photoresist layer along a portion of the sidewalls above the via plug of the via opening believed to be caused to either contaminating chemical interference with the DUV photoresist development process or the inability of the photolithographic irradiation step to adequately expose the sidewalls of the via opening. As a result, the upper portions of the via sidewalls above the via plug are contaminated with an undeveloped photoresist layer, also referred to as photoresist poisoning, that subsequently resists plasma etching during anisotropically etching the trench portion of the dual damascene structure forming a raised portion surrounding the via opening, also referred to as a fence, following trench etching. Consequently, subsequent metal filling processes for filling the dual damascene structure with, for example copper, results in poor step coverage including where the polymeric raised portion acts as a high electrical resistance barrier area leading to electrical reliability problems of semiconductor devices including the formation of open circuits.

There is therefore a need in the semiconductor processing art to develop a method whereby reliable photolithographic processes for damascene formation may be carried out without the detrimental effects of photoresist poisoning.

It is therefore an object of the invention to provide a method whereby reliable photolithographic processes for damascene formation may be carried out without the detrimental effects of photoresist poisoning while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for improving a photolithographic patterning process to avoid undeveloped photoresist contamination in a semiconductor manufacturing process.

In a first embodiment, the method includes providing a first semiconductor feature having an anisotropically etched opening including sidewalls said first semiconductor feature further provided with an overlying photoresist layer photolithographically patterned for anisotropically etching a second semiconductor feature opening overlying and encompassing the first semiconductor feature; blanket depositing a polymeric passivation layer over the overlying photoresist layer including covering at least a portion of the sidewalls said sidewalls including polymeric containing residues; and, removing the polymeric passivation layer including a substantial portion of the polymeric containing residues from the at least a portion of the sidewalls prior to anisotropically etching the second semiconductor feature.

These and other embodiments, aspects and features of the invention will become better understood from a detailed description of the preferred embodiments of the invention which are described below in conjunction with the accompanying drawings.

DETAILED DESCRIPTION OF THE PREFERRED EMBODIMENTS

Figure 1A:
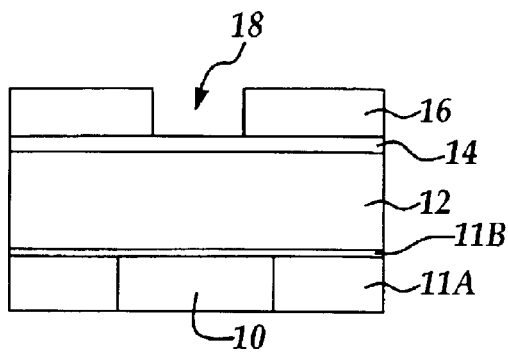
FIGS. 1A–1H are representative cross sectional side views of portions of a dual damascene structure at stages in the manufacturing process according to the present invention.

Although the present invention is explained with reference to a dual damascene process, it will be appreciated that the present invention may be adapted to the formation of any anisotropically etched semiconductor, where the photolithographic patterning of a second feature overlying the first feature advantageously avoids the accumulation of undeveloped photoresist contamination within the underlying first feature including the sidewalls and bottom portions.

In a first embodiment of the present invention, a first anisotropically etched semiconductor feature is provided including an overlying photolithographically patterned photoresist layer for anisotropically etching a second semiconductor feature overlying and encompassing the first anisotropically etched semiconductor feature. According to a first embodiment, a polymeric passivation layer is blanket deposited over the photoresist layer including at least covering a portion of the sidewalls of the first anisotropically etched semiconductor feature followed by a polymer plasma ashing process to remove the polymeric passivation layer including polymeric material including from at least a portion of the sidewalls of the first anisotropically etched semiconductor feature prior to anisotropically etching the second semiconductor feature.

In another embodiment, in a dual damascene via-first process, the first anisotropically etched semiconductor feature is a via opening including a polymeric via plug filling at least a portion of the via opening. Preferably, the via plug remains a level in the via opening following the polymer plasma etching process such that at least a portion of the via plug is removed during anisotropically etching the second semiconductor feature, preferably a trench opening, which includes etching through a portion of the via opening.

In another embodiment, the polymeric passivation layer is formed by a plasma process including a carbon rich fluoro-hydrocarbon etching chemistry. By the term 'carbon rich fluoro-hydrocarbon etching chemistry' is meant an etching chemistry including at least one fluoro-hydrocarbon with the overall etching chemistry having a fluorine to carbon ratio of less than about 4. For example, the fluoro-hydrocarbon etching chemistry includes $CH_2F_2$, $CHF_3$, $C_2F_8$, and $C_2F_6$ or mixtures thereof (where subscript represents the number of carbon and fluorine atoms) to form the polymer layer 28B. It will be appreciated that a fluorocarbon, for example $CF_4$ may be included in the plasma chemistry. More preferably, the fluorine to carbon ratio is less than about 3.

In another embodiment, in anisotropically etching the second semiconductor feature, a fluorine rich etching chemistry is preferably used to etch through a dielectric insulating material, preferably a low dielectric constant (less than about 3.0) material. By the term 'fluorine rich' is meant an etching chemistry including at least one fluorocarbon (optionally including hydro-fluorocarbons) or mixture thereof with the overall etching chemistry having a fluorine to carbon ratio of at least about 4. For example, an etching chemistry including mostly $CF_4$ as a fluorine containing gas would give an overall etching chemistry having a fluorine to carbon ratio of about 4.

Referring to FIG. 1A, in an exemplary embodiment of the present invention is shown a cross sectional side view of a portion of a multi-level semiconductor device including a stage in manufacturing a dual damascene structure. Shown for example, is a conductive region 10, for example, copper, formed in a dielectric insulating layer 11A having an overlying etching stop layer 11B, for example silicon nitride or silicon oxynitride. The etching stop layer is formed is deposited by a conventional chemical vapor deposition (CVD) process including for example, PECVD (plasma enhanced CVD), LPCVD (low pressure CVD), or HDPCVD (high density plasma CVD) having a thickness of about 200 Angstroms to about 1000 Angstroms. Formed over the etching stop layer 11B is insulating dielectric layer 12 also referred to as an inter-metal dielectric (IMD) layer formed of, for example, a low-k (low dielectric constant) carbon doped silicon dioxide. Typically, the dielectric constant of the IMD layer is less than about 3.0. It will be appreciated that other low-k materials may be used for the IMD layer and that the method according to the present invention is likewise applicable to those materials, particularly if they are porous materials. Exemplary low-k inorganic materials include, for example, porous oxides, xerogels, or SOG (spin-on glass). Exemplary low-k organic materials include, for example, polysilsequioxane, parylene, polyimide, benzocyclobutene amorphous Teflon, and spin-on polymer (SOP). For example the IMD layer is formed having a thickness of from about 3000 Angstroms to about 10000 Angstroms by a conventional plasma enhanced chemical vapor deposition process (PECVD), HDP-CVD, or spin on process.

A metal nitride etching stop layer 14 also preferably functioning as a dielectric anti reflectance coating (DARC) to reduce undesired light reflections in photolithographic patterning processes formed of, for example, silicon oxynitride (e.g., SiON) is deposited over the IMD layer 12. The silicon oxynitride layer is deposited by a conventional chemical vapor deposition (CVD) process including for example, PECVD (plasma enhanced CVD), LPCVD (low pressure CVD), or HDPCVD (high density plasma CVD) by reacting silane ($SiH_4$) and nitrogen, including nitrogen containing precursors, with oxygen under conditions that are well known in the art. It will be appreciated that a separate etching stop layer overlying the IMD layer 12, for example silicon nitride together with an overlying DARC layer of silicon oxynitride may also be suitably used in place of a silicon oxynitride etching stop layer 14. The etching stop layer 14 is preferably formed having a thickness of about 200 to about 1000 Angstroms.

Still referring to FIG. 1A, a photoresist layer 16 is next deposited over the etching stop layer and exposed and developed according to a conventional photolithographic patterning process to an anisotropic etching pattern for via openings, for example, via opening pattern 18. Preferably, a deep ultraviolet (DUV) photoresist is used for patterning the via openings including an activating radiation source with a wavelength of less than about 250 nm, to expose the photoresist layer 16. The photoresist layer 16 may be any conventional DUV photoresist layer including a bi-layer photoresist including, for example, a chemically amplified resist including a photogenerated acid. There are several suitable commercially available DUV photoresists including for example, PMMA and polybutene sulfone.

Figure 1B:
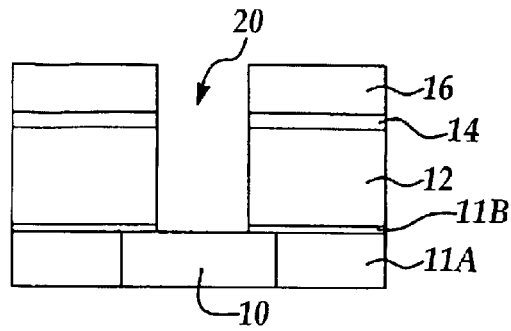

Referring to FIG. 1B, via opening 20 is anisotropically etched through the thickness of the etching stop layer 14, the IMD layer 12, and the etching stop layer 11B to create via opening 20 in closed communication with underlying conductive region 10. The anisotropic etching is carried out by conventional plasma reactive ion etch (RIE) processes including for example, mixtures of hydro-fluorocarbons, fluorocarbons, oxygen, and nitrogen.

Figure 1C:
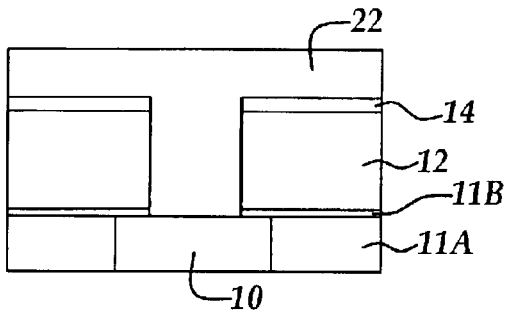

Referring to FIG. 1C, after removing the photoresist layer 16 by either a wet chemical stripping process or preferably a plasma ashing process including oxygen as is common in the art, a flowable resinous (polymeric) layer 22, for example, an I-line resin such as a conventional Novolac resin, is blanket deposited, for example by a spin-coating process, over the etching stop layer 14 to fill the via opening 20. It will be appreciated that the flowable resinous layer 22 may also suitably include a photoresist material, for example, the same photoresist in photoresist layer 16 used for patterning the via opening.

Figure 1D:
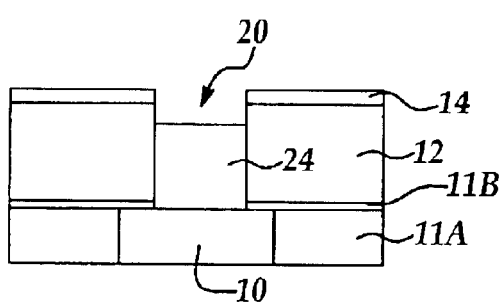

Referring to FIG. 1D, following deposition of the polymeric layer 22, the polymeric layer 22 is subjected to an etch-back process to form via plug 24. For example, the polymeric layer 22 is etched back to partially remove polymeric layer 22 from via opening 20 to form via plug 24 at least partially filling the via opening 20, having an upper surface preferably extending at least to a level of a bottom portion of a subsequently anisotropically etched overlying trench line opening. The etch-back process is carried out by a conventional RIE process, with for example an oxygen plasma or a fluorine based chemistry such as $CF_4$, and $CHF_3$ including oxygen.

Following the etch-back process to form via plug 24, via plug 24 is optionally cured, for example, by heating the via plug from about temperatures from about 100° C. to about 160° C. or by photo-curing if the via plug is formed of a photosensitive polymer by exposing to the via plug to an activating ultraviolet light source, for example, having a wavelength of less than about 400 nm, to initiate polymeric cross-linking reactions.

Figure 1E:
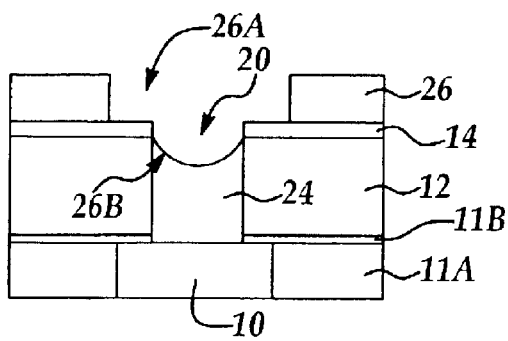

Referring to FIG. 1E, following via plug formation, a photoresist layer 26 (trench line photoresist) is deposited over the etching stop layer 14 and photolithographically patterned by exposure and development to form a trench opening pattern 26A for anisotropically etching a trench line opening overlying and encompassing via plug 24. Preferably the photoresist is a DUV photoresist designed for exposure and development at a wavelength less than about 250 nm as discussed with reference to via photoresist layer 18 in FIG. 1A. Due to what is believed to be either inadequate exposure of the DUV photoresist and/or the influence of contaminating species diffusing out from IMD layer 12, polymeric residues e.g., 26B from undeveloped DUV photoresist frequently remain on via opening 20 sidewalls above the via plug 24 following the development process.

Figure 1F:
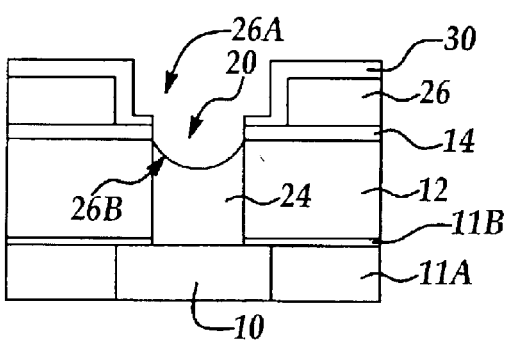

Referring to FIG. 1F, according to an embodiment of the present invention, a polymeric passivation layer 30 is blanket deposited over the DUV photoresist layer 26 to include covering the via opening 20 sidewalls above the via plug 24. Preferably, the polymeric passivation layer is formed by a plasma process using a carbon rich hydrofluorocarbon plasma, preferably having a carbon to fluorine ratio of less than about 4, for example, including $CH_2F_2$, is used to blanket deposit polymeric passivation layer 30. The polymeric passivation layer 30 is preferably formed having a thickness of about 100 Angstroms to about 500 Angstroms. For example, the polymeric passivation layer 30 covering the sidewalls of via opening 20 includes covering undeveloped photoresist or polymeric residues e.g., 26B formed on the via opening sidewalls from previous processes.

Figure 1G:
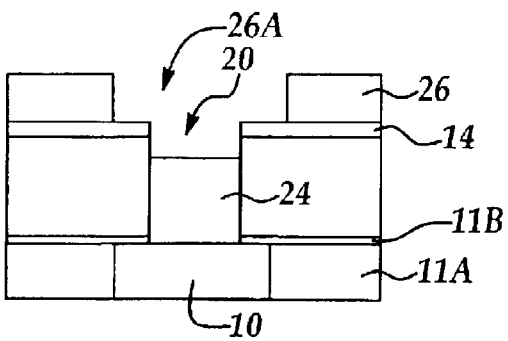

Referring to FIG. 1G, according to an embodiment of the present invention, a plasma ashing process including oxygen is carried out to remove the polymeric passivation layer 30 including any polymeric residues e.g., 26B covering the sidewall portions of via opening 20 above via plug 24. It will be appreciated that the oxygen plasma ashing process may include supplying hydrogen containing gases to form the plasma.

Figure 1H:
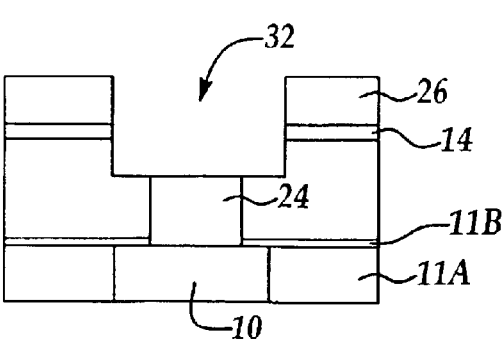

Referring to FIG. 1H, a conventional plasma anisotropic etching process (RIE) is then carried out to etch through the etching stop layer exposed underlying trench pattern 26A. According to another embodiment of the present invention, a fluorine rich plasma etching chemistry, preferably having an etching chemistry of at least about 4, is used to anisotropically etch through a portion of the IMD layer 12 including etching away a portion of the via opening 20 and via plug 24 to complete the formation of trench opening 32. The fluorine rich etching chemistry is used to minimize additional formation of polymeric residues on the trench opening and via sidewalls.

Following the trench line etching process, the trench line opening is completed by removing remaining via plug 24 from the via opening 20 and the trench line photoresist layer 26 (not shown). Preferably, a conventional plasma ashing process in an oxygen containing plasma is used; however, a wet chemical striping process as is known in the art may be suitably used as well.

The dual damascene structure is typically completed by forming an adhesion/barrier layer of for example, tantalum nitride (TaN) (not shown) over the floor and sidewalls of the trench line opening 28 and via opening 20 followed by filling with a metal, for example copper, and planarizing with a chemical mechanical polishing (CMP) process (not shown).

Figure 2:
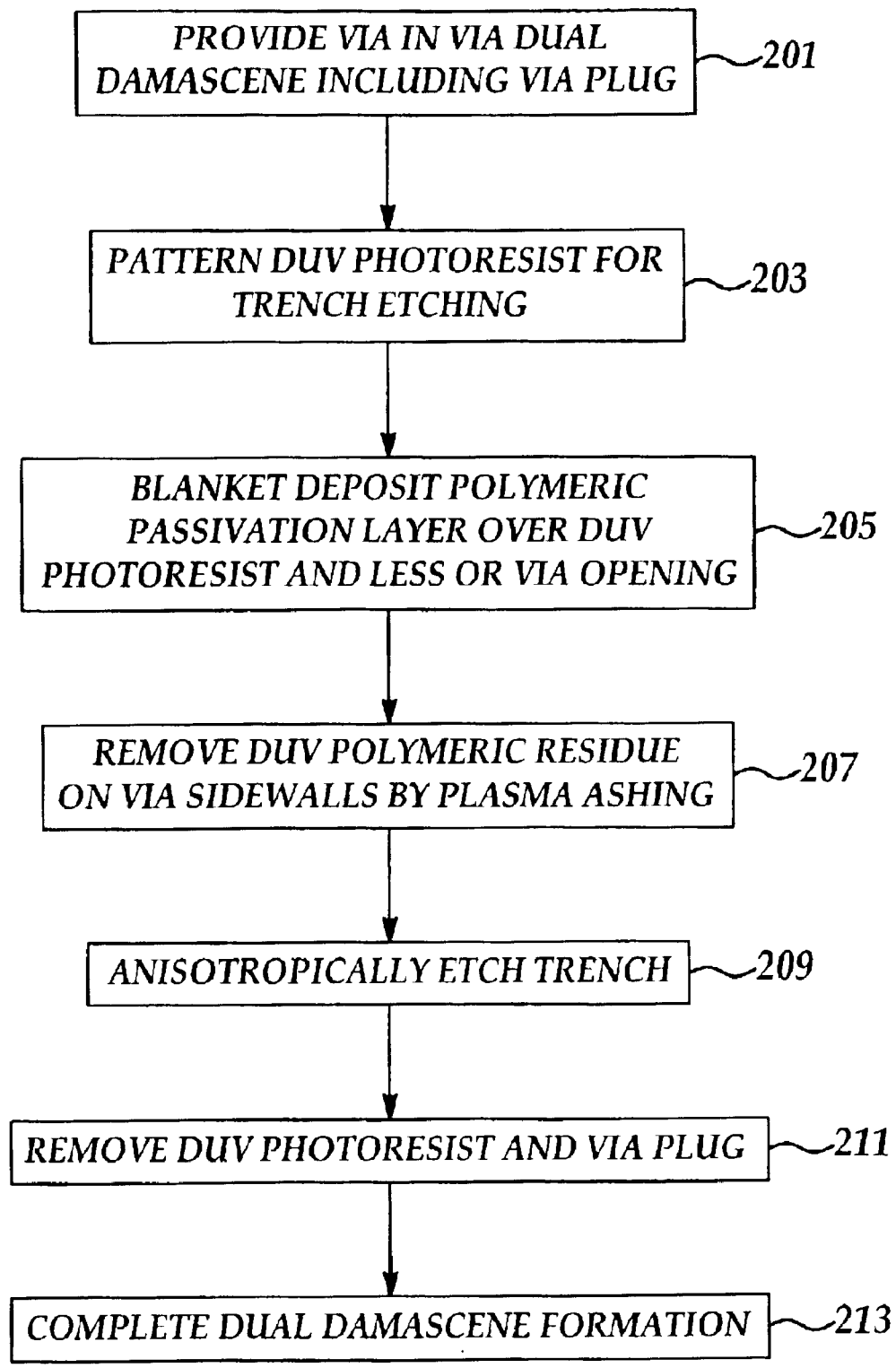
FIG. 2 is a representative process flow diagram according to one embodiment of the present invention.

Refer ring to FIG. 2, is shown a process flow diagram including several embodiments of the present invention. It will be understood that whenever reference herein is made to the singular of a semiconductor feature, for example, a via opening, that such reference includes a plurality of structures included in a semiconductor wafer. In addition it will be understood that multi-levels of semiconductor features are formed in sequential order to form a multi-level semiconductor device, thereby requiring repeating the process steps a number of times to complete formation of a semiconductor device.

According to several embodiments of the present invention, included in process 201 a first anisotropically etched semiconductor feature, preferably a via opening in a via first dual damascene process including a polymeric via plug at least partially filling the via opening is provided. In process 203 an overlying photoresist layer (overlying via opening), preferably a DUV photoresist layer, is photolithographically patterned for anisotropically etching a second semiconductor feature, preferably a trench line overlying and encompassing the via opening.

In process 205 a polymeric passivation layer is blanket (conformally) deposited according to a carbon rich plasma process over the DUV photoresist layer to include at least covering a portion of the via opening sidewalls, for example, above the via plug.

In process 207, the polymeric passivation layer is removed including a substantial portion of polymeric containing residues from at least a portion of the via sidewalls is removed according to a plasma ashing process.

In process 209, a trench line is anisotropically etched through the etching stop layer and the dielectric insulating layer (IMD layer) the etching chemistry for etching through the IMD layer preferably including a fluorine rich etching chemistry.

In process 211, the DUV photoresist layer including the via plug is removed according to at least one of a conventional plasma ashing process or a conventional wet chemical stripping process.

In process 213, the dual damascene structure is completed by conventional processes including, for example, depositing an adhesion/barrier layer and filling the dual damascene structure with a metal, for example copper, followed by a CMP process to remove excess material above the etching stop layer.

Thus, the method according to the present invention provides a method whereby a photolithographic patterning process in, for example, forming a dual damascene structure may be reliably carried out without the detrimental effects of photoresist poisoning caused by undeveloped photoresist remaining on underlying semiconductor features. In one embodiment, the method of the present invention prevents the formation of etching resistant polymeric residue including photoresist on the sidewalls of via openings thereby detrimentally affecting the formation of an overlying trench feature. The formation of the passivating polymer layer according to an embodiment of the present invention operates to protect the patterned trench opening photoresist layer while allowing a plasma ashing process to remove polymeric residues from the sidewalls of underlying via openings, preferably above a via plug thereby avoiding the formation of etching resistant via sidewall polymeric residues following trench line etching.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for improving a photolithographic patterning process to avoid undeveloped photoresist contamination in a semiconductor manufacturing process comprising the steps of:

providing a first semiconductor feature having an anisotropically etched opening including sidewalls said first semiconductor feature further provided with an overlying photoresist layer photolithographically patterned for anisotropically etching a second semiconductor feature opening overlying and encompassing the first semiconductor feature;

blanket depositing a polymeric passivation layer over the overlying photoresist layer including covering at least a portion of the sidewalls said sidewalls including polymeric containing residues; and, removing the polymeric passivation layer including a substantial portion of the polymeric containing residues from the at least a portion of the sidewalls prior to anisotropically etching the second semiconductor feature.

2. The method of claim 1, wherein the first semiconductor feature having an anisotropically etched opening includes a via opening and the second semiconductor feature includes a trench opening.

3. The method of claim 2, wherein the step of providing a first semiconductor feature includes forming a via plug of polymeric material filling at least a portion of the via opening prior to providing an overlying photoresist layer.

4. The method of claim 3, wherein the via plug is formed having an upper surface such that at least a portion of the via plug is removed in anisotropically etching the trench opening.

5. The method of claim 3, wherein the polymeric material includes at least one of a photoresist or polymeric resin.

6. The method of claim 2, further comprising the steps of:
anisotropically etching the trench opening; and,
removing the overlying photoresist layer and the via plug.

7. The method of claim 6, wherein the step of anisotropically etching the trench opening includes etching through a dielectric insulating layer using an anisotropic etching chemistry formed by supplying etching gases to form a plasma having a carbon to fluorine ratio of at least about 4.

8. The method of claim 6, wherein the step of removing the overlying photoresist layer and the via plug includes at least one of a plasma ashing process and a wet chemical stripping process.

9. The method of claim 1, wherein the overlying photoresist layer includes a photoresist responsive to activating light of less than about 250 nm.

10. The method of claim 1, wherein the first semiconductor feature is formed in a dielectric insulating layer having a dielectric constant of less than about 3.0.

11. The method of claim 1, wherein the polymeric passivation layer is formed by a plasma process supplied with hydro-fluorocarbon etching gases to form a plasma having a carbon to fluorine ratio of less than about 4.

12. The method of claim 1, wherein the polymeric passivation layer is formed by a plasma process supplied with hydro-fluorocarbons etching gases to form a plasma having carbon to fluorine ratio of less than about 3.

13. The method of claim 1, wherein the step of removing the polymeric passivation layer includes a plasma ashing process supplied with etching gases including at least one of oxygen and hydrogen.

14. A method for improving a photolithographic patterning process to avoid undeveloped photoresist contamination in a dual damascene semiconductor manufacturing process comprising the steps of:

providing at least one via opening including a via plug formed of polymeric resin filling at least a portion of the at least one via opening said at least one via opening further provided with an overlying photoresist layer photolithographically patterned for anisotropically etching a trench line opening overlying and encompassing said at least one via opening;

depositing a polymeric passivation layer over the overlying photoresist layer according to a plasma etching process including covering at least a portion of the sidewalls said sidewalls including polymeric containing residues; and, removing the polymeric passivation layer according to a plasma ashing process including a substantial portion of the polymeric containing residues from the at least a portion of the sidewalls prior to anisotropically etching the trench line opening.

15. The method of claim 14, wherein the via plug is formed having an upper surface such that at least a portion of the via plug is removed in anisotropically etching the trench opening.

16. The method of claim 15, wherein the polymeric material includes at least one of a photoresist or polymeric resin.

17. The method of claim 14, wherein the overlying photoresist layer includes a photoresist responsive to activating light of less than about 250 nm.

18. The method of claim 14, wherein the polymeric passivation layer is formed by a plasma process supplied with hydro-fluorocarbon etching gases to form a plasma having a carbon to fluorine ratio of less than about 4.

19. The method of claim 14, wherein the step of removing the polymeric passivation layer includes a plasma ashing process supplied with etching gases including at least one of oxygen and hydrogen.

20. The method of claim 14, further comprising the steps of:

anisotropically etching the trench opening using an anisotropic etching chemistry formed by supplying etching gases to form a plasma having a carbon to fluorine ratio of at least about 4; and, removing the overlying photoresist layer and the via plug according to at least one of a plasma ashing process and a wet chemical stripping process.

* * * * *